(12) United States Patent
Asami et al.

(10) Patent No.: US 8,526,216 B2
(45) Date of Patent: *Sep. 3, 2013

(54) MEMORY DEVICE AND MANUFACTURING METHOD THE SAME

(75) Inventors: Yoshinobu Asami, Atsugi (JP); Tamae Takano, Atsugi (JP); Masayuki Sakakura, Isehara (JP); Ryoji Nomura, Yamato (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/546,013

(22) Filed: Jul. 11, 2012

(65) Prior Publication Data

US 2012/0273778 A1  Nov. 1, 2012

Related U.S. Application Data

(63) Continuation of application No. 12/711,333, filed on Feb. 24, 2010, now Pat. No. 8,238,152, which is a continuation of application No. 11/389,238, filed on Mar. 27, 2006, now Pat. No. 8,030,643.

(30) Foreign Application Priority Data

Mar. 28, 2005 (JP) ................... 2005-091318

(51) Int. Cl.
  *G11C 11/34* (2006.01)
  *G11C 11/00* (2006.01)
  *H01L 29/12* (2006.01)

(52) U.S. Cl.
  USPC ...... 365/148; 365/174; 257/43; 257/E51.001; 257/E51.024

(58) Field of Classification Search
  USPC ........................................... 365/148
  See application file for complete search history.

(56) References Cited

U.S. PATENT DOCUMENTS 5,313,101 A  5/1994  Harada et al.
5,341,026 A  8/1994  Harada et al.

(Continued)

FOREIGN PATENT DOCUMENTS

EP  1098290 A  5/2001
EP  1443130 A  8/2004

(Continued)

OTHER PUBLICATIONS

Office Action (Application No. JP2010-046236) Dated Sep. 18, 2012.

(Continued)

*Primary Examiner* — Son Mai
(74) *Attorney, Agent, or Firm* — Eric J. Robinson; Robinson Intellectual Property Law Office, P.C.

(57) ABSTRACT

A semiconductor device that can transmit and receive data without contact is popular partly as some railway passes, electronic money cards, and the like; however, it has been a prime task to provide an inexpensive semiconductor device for further popularization. In view of the above current conditions, a semiconductor device of the present invention includes a memory with a simple structure for providing an inexpensive semiconductor device and a manufacturing method thereof. A memory element included in the memory includes a layer containing an organic compound, and a source electrode or a drain electrode of a TFT provided in the memory element portion is used as a conductive layer which forms a bit line of the memory element.

22 Claims, 8 Drawing Sheets

(56) References Cited

U.S. PATENT DOCUMENTS

| | | |
|---|---|---|
| 5,436,552 A | 7/1995 | Kajimoto |
| 5,650,834 A | 7/1997 | Nakagawa et al. |
| 5,930,667 A | 7/1999 | Oda |
| 5,952,789 A | 9/1999 | Stewart et al. |
| 6,243,069 B1 | 6/2001 | Ogawa et al. |
| 6,365,933 B1 | 4/2002 | Yamazaki et al. |
| 6,507,010 B1 | 1/2003 | Yamazaki et al. |
| 6,577,531 B2 | 6/2003 | Kato |
| 6,714,178 B2 | 3/2004 | Koyama et al. |
| 6,759,146 B2 | 7/2004 | Aziz et al. |
| 6,765,549 B1 | 7/2004 | Yamazaki et al. |
| 6,809,952 B2 | 10/2004 | Masui |
| 6,992,332 B2 | 1/2006 | Yamazaki et al. |
| 7,061,014 B2 | 6/2006 | Hosono et al. |
| 7,064,346 B2 | 6/2006 | Kawasaki et al. |
| 7,075,105 B2 | 7/2006 | Kano |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,354,647 B2 | 4/2008 | Kano |
| 7,402,506 B2 | 7/2008 | Levy et al. |
| 7,462,862 B2 | 12/2008 | Hoffman et al. |
| 7,499,305 B2 | 3/2009 | Nomura et al. |
| 7,642,573 B2 | 1/2010 | Hoffman et al. |
| 7,674,650 B2 | 3/2010 | Akimoto et al. |
| 7,723,179 B2 | 5/2010 | Yamazaki et al. |
| 7,732,819 B2 | 6/2010 | Akimoto et al. |
| 7,863,611 B2 | 1/2011 | Abe et al. |
| 7,875,881 B2 | 1/2011 | Ikeda et al. |
| 7,973,313 B2 | 7/2011 | Arai et al. |
| 8,203,146 B2 | 6/2012 | Abe et al. |
| 8,238,152 B2 * | 8/2012 | Asami et al. ............... 365/174 |
| 2003/0118927 A1 | 6/2003 | Nakamura et al. |
| 2003/0197466 A1 | 10/2003 | Yamazaki et al. |
| 2003/0218222 A1 | 11/2003 | Wager et al. |
| 2004/0026690 A1 | 2/2004 | Bernds et al. |
| 2004/0057323 A1 | 3/2004 | Tanabe |
| 2006/0097250 A1 | 5/2006 | Koyama et al. |
| 2006/0102919 A1 | 5/2006 | Watanabe et al. |
| 2006/0113565 A1 | 6/2006 | Abe et al. |
| 2006/0169973 A1 | 8/2006 | Isa et al. |
| 2006/0175648 A1 | 8/2006 | Asami |
| 2006/0186804 A1 | 8/2006 | Sakakura et al. |
| 2006/0197092 A1 | 9/2006 | Hoffman et al. |
| 2006/0208977 A1 | 9/2006 | Kimura |
| 2006/0220252 A1 | 10/2006 | Yukawa et al. |
| 2006/0238135 A1 | 10/2006 | Kimura |
| 2007/0108446 A1 | 5/2007 | Akimoto |
| 2007/0194379 A1 | 8/2007 | Hosono et al. |
| 2007/0200125 A1 | 8/2007 | Ikeda et al. |
| 2007/0230235 A1 | 10/2007 | Abe et al. |
| 2008/0210928 A1 | 9/2008 | Abe et al. |
| 2008/0254569 A1 | 10/2008 | Hoffman et al. |
| 2009/0269880 A1 | 10/2009 | Itagaki et al. |
| 2009/0278122 A1 | 11/2009 | Hosono et al. |
| 2010/0117073 A1 | 5/2010 | Yamazaki et al. |
| 2011/0169843 A1 | 7/2011 | Sasaki et al. |
| 2011/0223966 A1 | 9/2011 | Arai et al. |

FOREIGN PATENT DOCUMENTS

| | | |
|---|---|---|
| EP | 1 453 088 | 9/2004 |
| JP | 06-104672 A | 4/1994 |
| JP | 09-162370 A | 6/1997 |
| JP | 2001-222256 A | 8/2001 |
| JP | 2001-345431 | 12/2001 |
| JP | 2002-026282 A | 1/2002 |
| JP | 2002-026283 A | 1/2002 |
| JP | 2002-043517 A | 2/2002 |
| JP | 2002-076356 A | 3/2002 |
| JP | 2002-198496 A | 7/2002 |
| JP | 2004-047446 A | 2/2004 |
| JP | 2004-103957 A | 4/2004 |
| JP | 2004-128471 | 4/2004 |
| JP | 2004-213910 A | 7/2004 |
| JP | 2004-282050 A | 10/2004 |
| JP | 2004-304179 A | 10/2004 |
| JP | 2004-304180 A | 10/2004 |
| JP | 2006-165532 A | 6/2006 |
| WO | WO 02/37500 | 5/2002 |
| WO | WO 2004/015778 | 2/2004 |
| WO | WO 2004/114391 | 12/2004 |
| WO | WO 2006/043573 | 4/2006 |

OTHER PUBLICATIONS

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Nakamura et al., "The Phase Relations in the $In_2O_3$—$Ga_2ZnO_4$—ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$=3, 4, and 5), $InGaO_3(ZnO)_3$, and $Ga_2O_3(ZnO)m$ ($m$=7, 8, 9, and 16) in the $In_2O_3$—$ZnGa_2O_4$—ZnO System," Journal of Solid State Chemistry, Apr. 1, 1995, vol. 116, No. 1, pp. 170-178.

Li et al., "Modulated Structures of Homologous Compounds In$MO_3$(ZnO)m ($M$=In,Ga; $m$=Integer) Described by Four-Dimensional Superspace Group," Journal of Solid State Chemistry, 1998, vol. 139, pp. 347-355.

Taiwanese Office Action (Application No. 095110562) Dated Feb. 26, 2013.

* cited by examiner memory element portion | connection portion

MEMORY DEVICE AND MANUFACTURING METHOD THE SAME

BACKGROUND OF THE INVENTION

1. Field of the Invention

The present invention relates to a semiconductor device capable of transmitting and receiving data and a driving method thereof.

Note that the term "semiconductor device" used in this specification refers to a device in general that can operate by utilizing semiconductor characteristics, and an electro-optical device, a semiconductor circuit, and an electronic device are all included in the semiconductor device.

2. Description of the Related Art

In recent years, a semiconductor device that transmits and receives data without contact using an electromagnetic field or an electric wave has been developed. Such a semiconductor device is called an RF (Radio Frequency) tag, a wireless tag, an electronic tag, a transponder, or the like. Most semiconductor devices currently in practical use have circuits each using a semiconductor substrate (such a circuit is also referred to as an IC (Integrated Circuit) chip) and antennas. In the IC chip, a memory and a control circuit are incorporated.

Although a semiconductor device that can transmit and receive data without contact is popular partly as some railway passes, electronic money cards, and the like, it has been a prime task to provide an inexpensive semiconductor device for further popularization.

SUMMARY OF THE INVENTION

In view of the above current conditions, it is an object of the present invention to provide a semiconductor device including a memory with a simple structure for providing an inexpensive semiconductor device and a manufacturing method thereof.

It is another object of the invention to reduce the number of steps in a manufacturing method of a semiconductor device including a memory.

One feature of the invention is a memory device including a layer containing an organic compound, in which a source electrode or a drain electrode of a TFT provided in the memory device is used as a conductive layer forming a bit line of the memory device. Compared to a structure in which a source electrode or a drain electrode of a TFT is connected to a conductive layer of a memory device through a connection electrode, the present invention, in which a source electrode or a drain electrode of a TFT and a bit line of a memory device are formed with one wire, can reduce contact resistance and wiring resistance. Therefore, the present invention can reduce power consumption of a semiconductor device.

Another feature is that the source electrode or drain electrode of the TFT provided in the memory element portion is processed by etching into the conductive layer which forms the bit line of the memory device.

A constitution of the invention disclosed in this specification is a memory device, as one example thereof is shown in FIG. 1, includes a bit line extending in a first direction; a word line extending in a second direction perpendicular to the first direction; and a memory cell including a memory element, the memory element includes a laminated structure of a conductive layer forming the bit line, an organic compound layer, and a conductive layer forming the word line, and the conductive layer forming the bit line is an electrode in contact with a semiconductor layer of a thin film transistor.

Another constitution of the invention is a memory device, as one example thereof is shown in FIG. 2, includes a bit line extending in a first direction; a word line extending in a second direction perpendicular to the first direction; and a memory cell including a memory element, the memory element includes a laminated structure of a conductive layer forming the bit line, an organic compound layer, and a conductive layer forming the word line, the conductive layer forming the bit line is an electrode in contact with a semiconductor layer of a thin film transistor, and the conductive layer forming the bit line includes a first region where two metal films are laminated and a second region where three metal films are laminated.

Another constitution of the invention is a memory device, as one example thereof is shown in FIG. 3, includes a bit line extending in a first direction; a word line extending in a second direction perpendicular to the first direction; and a memory cell including a memory element, the memory element includes a laminated structure of a conductive layer forming the bit line, an organic compound layer, and a conductive layer forming the word line, the conductive layer forming the bit line is an electrode in contact with a semiconductor layer of a thin film transistor, and the conductive layer forming the bit line includes a first region including a single metal film and a second region where three metal films are laminated.

Another constitution of the invention is a memory device, as one example thereof is shown in FIG. 4, includes a bit line extending in a first direction; a word line extending in a second direction perpendicular to the first direction; and a memory cell including a memory element, the memory element includes a laminated structure of a conductive layer forming the bit line, an organic compound layer, and a conductive layer forming the word line, the conductive layer forming the bit line is an electrode in contact with a semiconductor layer of a thin film transistor, and the conductive layer forming the bit line includes a first region two metal films are laminated, a second region where three metal films are laminated, and a boundary between the first region and the second region is covered with an insulating film.

Another constitution of the invention is a memory device includes a bit line extending in a first direction; a word line extending in a second direction perpendicular to the first direction; and a memory cell including a memory element, the memory element includes a laminated structure of a conductive layer fowling the bit line, an organic compound layer, and a conductive layer forming the word line, the conductive layer forming the bit line is an electrode in contact with a semiconductor layer of a thin film transistor, the conductive layer forming the bit line includes a first region including a single metal film and a second region three metal films are laminated, and a boundary between the first region and the second region is covered with an insulating film.

In each of the above constitutions, the conductive layer forming the bit line is a single-layer film of an element selected from Ti, Al, Ag, Ni, W, Ta, Nb, Cr, Pt, Zn, Sn, In, and Mo, or an alloy or compound material containing the above element as its main component, or a laminated film thereof.

In each of the above constitutions, either or both the conductive layer forming the bit line and the conductive layer forming the word line may include a light transmitting property. In addition, the thin film transistor may be an organic transistor.

In each of the above constitutions, an element including a rectifying property may be provided between the conductive layer forming the bit line and the organic compound layer or between the organic compound layer and the conductive layer forming the word line. Note that, as the element having a rectifying property, a thin film transistor, a diode, or the like whose gate electrode and drain electrode are connected to each other can be used.

In each of the above constitutions, a buffer layer or an organic compound layer is provided in contact with the first region of the conductive layer forming the bit line.

In each of the above constitutions, the memory device is to further include a control circuit for controlling the memory element, and an antenna.

In addition, a method for manufacturing a memory device is also one of the present invention. The method for manufacturing a memory device including a bit line extending in a first direction, a word line extending in a second direction perpendicular to the first direction, and a memory cell including a memory element, the method comprises: forming a bit line including laminated metal layers; forming an insulating film covering at least an end portion of the bit line; thinning a part of the bit line by etching using the insulating film as a mask, thereby forming a depression in the bit line, the depression having a slanted side surface; forming a layer containing an organic compound over the insulating film and the depression; and forming a word line over the layer containing the organic compound.

In addition, another method for manufacturing a memory device is a method for manufacturing a memory device including a bit line extending in a first direction, a word line extending in a second direction perpendicular to the first direction, and a memory cell including a memory element, the method comprises: forming a thin film transistor including a semiconductor layer; forming an insulating film covering the thin film transistor; forming an electrode including laminated metal layers in contact with the semiconductor layer, over the insulating film; removing a part of the electrode, thereby forming a first region and a second region wherein a number of laminated metal layers in the second region is larger than that in the first region; forming an insulating film covering the second region of the electrode and a boundary between the first and second regions; forming a buffer layer over the first region; forming a layer containing an organic compound over the buffer layer; and forming a word line over the layer containing the organic compound.

The present invention can reduce the number of steps in a method for manufacturing a semiconductor device including an active matrix type memory device.

DETAILED DESCRIPTION OF THE INVENTION

Figure 1:
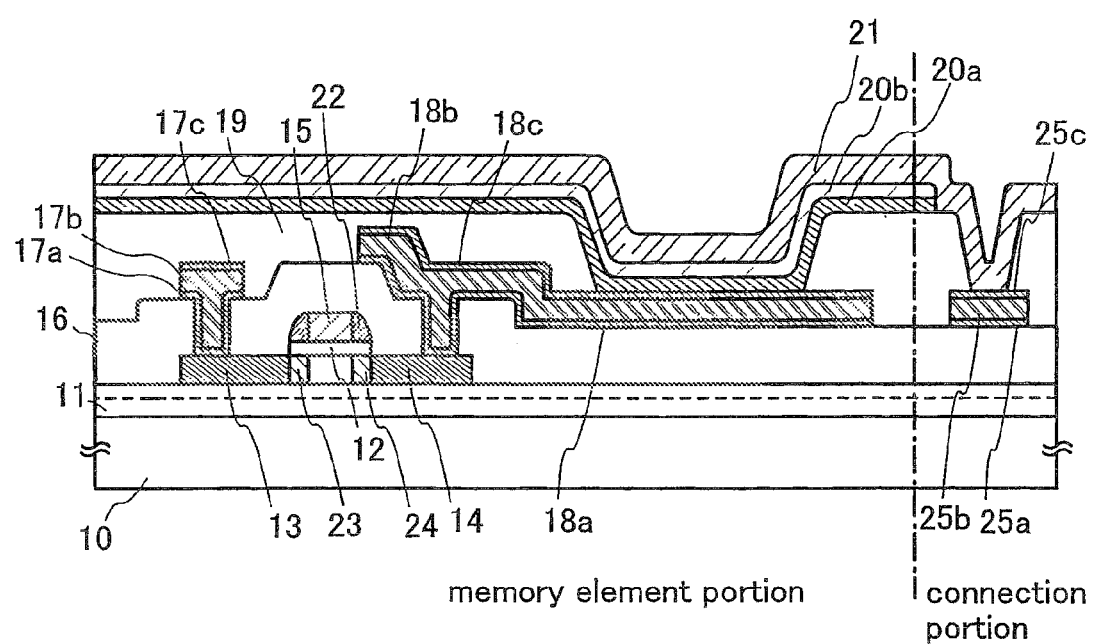
FIG. 1 is a cross-sectional view showing Embodiment Mode 1.

Hereinafter, embodiment modes of the present invention are explained with reference to the drawings. However, the invention can be carried out in many different modes. As is easily known to a person skilled in the art, the mode and the detail of the invention can be variously changed without departing from the spirit and the scope of the invention. Thus, the present invention is not interpreted while limiting to the following description of the embodiment modes. Note that the same reference numeral is used to denote the same portion or a portion having a similar function among the drawings shown below, and repetitive description thereof is omitted.

Embodiment Mode 1

FIG. 1 is a cross-sectional view of one example of a semiconductor device of the present invention, specifically, a memory device including a plurality of memory element each of which includes an organic compound layer are arranged (such a device is hereinafter also referred to as an organic memory or an organic memory device).

In FIG. 1, a TFT (n-channel TFT or p-channel TFT) provided over a substrate 10 having an insulating surface is an element for controlling a current flowing to an organic compound layer 20b of a memory cell, and reference numerals 13 and 14 denote source or drain regions.

A base insulating film 11 (here, a lower layer thereof is a nitride insulating film and an upper layer thereof is an oxide insulating film) is formed over the substrate 10, and a gate insulating film 12 is provided between a gate electrode 15 and a semiconductor layer. In addition, a side face of the gate electrode 15 is provided with a sidewall 22. Further, a reference numeral 16 denotes an interlayer insulating film formed with a single layer of an inorganic material such as silicon oxide, silicon nitride, silicon nitride oxide, aluminum nitride, or aluminum nitride oxide, or a laminated layer thereof. Although not shown here, one memory cell may be provided with one or more TFTs (n-channel TFT or p-channel TFT) in addition to the TFT shown in the diagram. Moreover, although a TFT including one channel formation region is shown here, there is no particular limitation. A TFT including a plurality of channel formation regions may be employed.

As shown in FIG. 1, a lightly doped drain (LDD) structure, which includes LDD regions 23 and 24 between the channel formation region and the source or drain regions, may be employed. In this structure, a region to which an impurity element is added in low concentration is provided between the channel formation region and the source or drain regions formed by adding an impurity element in high concentration. This region is referred to as an LDD region.

Reference numerals 18a to 18c denote layers included in a first electrode layer, in other words, a conductive layer forming a bit line of the memory element. The first electrode layer has a three-layer structure. Here, a titanium film as the conductive layer 18a, a film containing aluminum as its main component as the layer 18b, and a titanium film as the layer 18c are sequentially laminated. It is preferable to use a titanium film as the layer 18a which is in contact with the source or drain region because contact resistance can be reduced. A film containing aluminum as its main component has low electrical resistance; therefore, it has the advantage of being able to reduce resistance of the entire wiring when having the largest thickness in the three-layer structure. In addition, a film containing aluminum as its main component is easy to be oxidized and to generate a projecting portion such as a hillock when subjected to heat or the like in a subsequent step. Therefore, a titanium film is preferably laminated to prevent oxidation and formation of a projecting portion. A film containing aluminum as its main component becomes an insulating film when oxidized, whereas a titanium film has a semiconductor property even when oxidized. Therefore, a titanium film can suppress an increase in electrical resistance as compared to a film containing aluminum as its main component. Considering these points, the titanium film as the layer 18a, the film containing aluminum as its main component as the layer 18b, and the titanium film as the layer 18c are preferably formed continuously without exposure to the atmosphere.

In addition, a source line including layers 17a to 17c is also formed with the same laminated structure (three layers in total). The laminated structure (three layers in total) includes a film containing aluminum as its main component, which can serve as a low-resistance wire, and a connection wire including layers 25a to 25c of a connection portion is also formed at the same time.

In addition to the TFTs arranged in the memory element portion, a driver circuit for controlling operation of the memory element portion can also be formed. Further, a lead wiring of the driver circuit can also be formed with the same laminated structure (three layers in total), so that the driver circuit can be formed with a low-resistance wiring. By forming the driver circuit with a low-resistance wiring, power consumption of the driver circuit can be reduced. The driver circuit for controlling operation of the memory element portion is, for example, a decoder, a sense amplifier, a selector, a buffer, a read circuit, a write circuit, or the like.

An insulating film 19 is provided between memory cells. The insulating film 19 is provided at the boundary between adjacent memory cells to surround and cover the periphery of the first electrode layer including the layers 18a to 18c. As the insulating film 19, a single-layer structure of an inorganic material containing oxygen or nitrogen, such as silicon oxide ($SiO_X$), silicon nitride ($SiN_X$), silicon oxynitride ($SiO_XN_Y$) (X>Y), or silicon nitride oxide ($SiN_XO_Y$) (X>Y), or the like or a laminated structure thereof can be used. Alternatively, the insulating film 19 is formed to have a single-layer or laminated structure with an organic material such as polyimide, polyamide, polyvinylphenol, benzocyclobutene, acryl, or epoxy, or the like. Further, it may be formed with a laminate of an inorganic material and an organic material.

For a second electrode layer 21, a single-layer or laminated structure of an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), and tantalum (Ta) or an alloy containing a plurality of the elements can be used.

In addition, a laminated layer containing an organic compound (a laminated layer of a first layer (buffer layer 20a) and a second layer (organic compound layer 20b)) is provided between the first electrode layer including the layers 18a to 18c and the second electrode layer 21.

The buffer layer 20a is a composite layer of an organic compound and an inorganic compound which can exhibits an electron accepting property to the organic compound, specifically, a composite layer containing metal oxide and an organic compound. The buffer layer can also provide excellent conductivity in addition to an effect such as improvement in heat resistance, which is thought to be obtained by mixing an inorganic compound.

Specifically, the buffer layer 20a is a composite layer containing metal oxide (such as molybdenum oxide, tungsten oxide, or rhenium oxide) and an organic compound (such as a material having a hole transport property (for example, 4,4'-bis[N-(3-methyphenyl)-N-phenylamino]biphenyl (abbr.: TPD), 4,4'-bis[N-(1-naphthyl)-N-phenylamino]biphenyl (abbr.: α-NPD), 4,4'-{N-[4-(N,N-di-m-tolylamino)phenyl]-N-phenylamino}biphenyl (abbr.: DNTPD), or the like)).

By providing the buffer layer on the first electrode layer, a distance between a third layer of the first electrode layer and the second electrode layer in a memory element can be increased, and initial failure due to a short circuit of the memory element caused by surface unevenness of a metal electrode, or the like can be suppressed.

The organic compound layer 20b as the second layer is formed with a single-layer or laminated layers of a layer formed of an organic compound material having conductivity. As a specific example of the organic compound material having conductivity, a material having a carrier transport property can be used.

In the case where the third layer of the first electrode layer and the second layer 20b have poor adhesion to each other, the buffer layer can improve adhesion when provided therebetween. Since the buffer layer is the composite layer containing metal oxide and an organic compound, it has good adhesion to both the first electrode layer which is formed of metal and the second layer which is formed of an organic compound.

Although explanation is made here taking a top-gate TFT as an example, the invention can be applied regardless of a TFT structure, for example, to a bottom-gate (inverted staggered) TFT and a staggered TFT. Moreover, the invention is not limited to a TFT having a single-gate structure, and a multi-gate TFT having a plurality of channel formation regions, for example, a double-gate TFT may also be employed.

In this specification, a semiconductor film containing silicon as its main component, a semiconductor film containing an organic material as its main component, or a semiconductor film containing metal oxide as its main component can be used as the semiconductor layer serving as an active layer of the TFT. As the semiconductor film containing silicon as its main component, an amorphous semiconductor film, a semiconductor film having a crystalline structure, a compound semiconductor film having an amorphous structure, or the like can be used. Specifically, amorphous silicon, microcrystalline silicon, polycrystalline silicon, or the like can be used for the semiconductor film containing silicon as its main component. As the semiconductor film containing an organic material as its main component, a semiconductor film containing, as its main component, a substance which includes a certain amount of carbon or an allotrope of carbon (excluding diamond), which is combined with another element, can be used. Specifically, pentacene, tetracene, a thiophen oligomer derivative, a phenylene derivative, a phthalocyanine compound, a polyacetylene derivative, a polythiophene derivative, a cyanine dye, or the like can be used. Further, as the semiconductor film containing metal oxide as its main component, zinc oxide (ZnO); oxide of zinc, gallium, and indium (In—Ga—Zn—O); or the like can be used.

Furthermore, transfer to a flexible substrate may be performed using a peeling technique. In that case, a and a memory device are manufactured after forming a peeling layer or a separation layer over a first substrate such as a glass substrate. Then, the peeling layer or the separation layer is removed, and the TFT and the memory device peeled off from the first substrate may be transferred to a second substrate that is a flexible substrate.

Embodiment Mode 2

Figure 2:
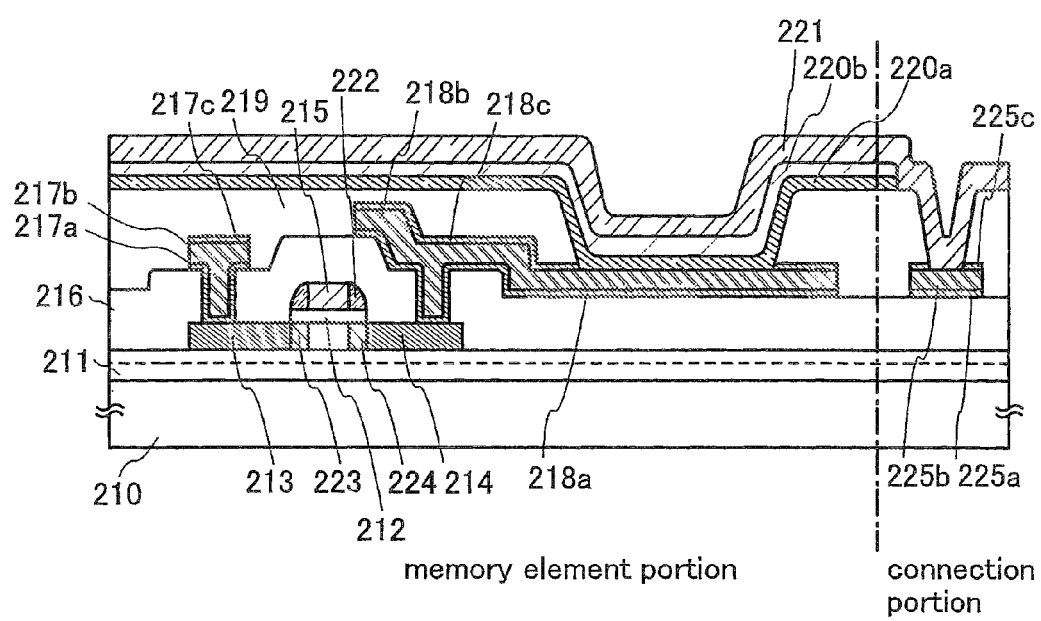
FIG. 2 is a cross-sectional view showing Embodiment Mode 2.

In this embodiment mode, an example of a memory device, which has a different structure from that in Embodiment Mode 1, is shown in FIG. 2.

The structure shown in FIG. 2 includes a first region where part of a first electrode layer is thinner due to etching using an insulating film 219 as a mask, and the first region is in contact with a laminated layer containing an organic compound (a buffer layer 220a and an organic compound layer 220b) of a memory cell. The insulating film 219 is provided at the boundary between adjacent memory cells to surround and cover the periphery of the first electrode layer.

A first electrode layer including layers 218a to 218c is a conductive layer forming a bit line of a memory element. The first electrode layer including the layers 218a to 218c has a first region with two layers 218a, 218b, a second region with three layers 218a to 218c, and a step at the boundary between the first region and the second region. Here, a titanium film as the layer 218a, a film containing aluminum as its main component as the layer 218b, and a titanium film as the layer 218c are sequentially laminated.

In addition, a source line including layers 217a to 217c is also formed with the same laminated structure (three layers in total). The laminated structure (three layers in total) includes a film containing aluminum as its main component, which can serve as a low-resistance wiring, and a connection wiring including layers 225a to 225c of a connection portion is also formed at the same time.

Note that in FIG. 2, a TFT (n-channel TFT or p-channel TFT) provided over a substrate 210 having an insulating surface is an element for controlling a current flowing to the organic compound layer 220b of the memory cell, and reference numerals 213 and 214 denote source or drain regions. Further, the TFT shown in FIG. 2 has LDD regions 223 and 224 between a channel formation region and the source or drain regions.

A base insulating film 211 (here, a lower layer thereof is a nitride insulating film and an upper layer thereof is an oxide insulating film) is formed over the substrate 210, and a gate insulating film 212 is provided between a gate electrode 215 and a semiconductor layer. In addition, a side face of the gate electrode 215 is provided with a sidewall 222. Further, a reference numeral 216 denotes an interlayer insulating film formed with a single layer of an inorganic material such as silicon oxide, silicon nitride, silicon nitride oxide, aluminum nitride, or aluminum nitride oxide, or a laminated layer thereof.

By providing the buffer layer 220a on the first electrode layer, a distance between the first electrode layer and a second electrode layer 221 in a memory element can be increased, and initial failure due to a short circuit of the memory element caused by surface unevenness of a metal electrode, or the like can be suppressed. In the case where the second layer 218b of the first electrode layer and the organic compound layer 220b have poor adhesion to each other, the buffer layer 220a can improve adhesion when provided between these layers. In the structure shown in FIG. 2, the second layer 218b of the first electrode layer and the buffer layer 220a are in contact with each other, and part of the first insulating layer 218c is removed. With the structure in which part of the first electrode layer 218c is removed and the film containing aluminum as its main component and the buffer layer 220a are in contact with each other, electrical resistance of a memory element can be reduced.

The organic compound layer 220b which is the second layer is formed with a single-layer or laminated structure of a layer formed of an organic compound material having conductivity. As a specific example of the organic compound material having conductivity, a material having a carrier transport property can be used.

Note that if there is no particular necessity, the buffer layer 220a need not necessarily be provided.

In the case of the structure shown in FIG. 2, the second electrode layer 221 is in contact with the second layer of the first electrode layer in the connection portion. By using materials containing the same metal element for their main components of the second electrode layer 221 and the second layer of the first electrode layer, they can be connected to each other with low contact resistance.

This embodiment mode can be freely combined with Embodiment Mode 1.

Embodiment Mode 3

Figure 3:
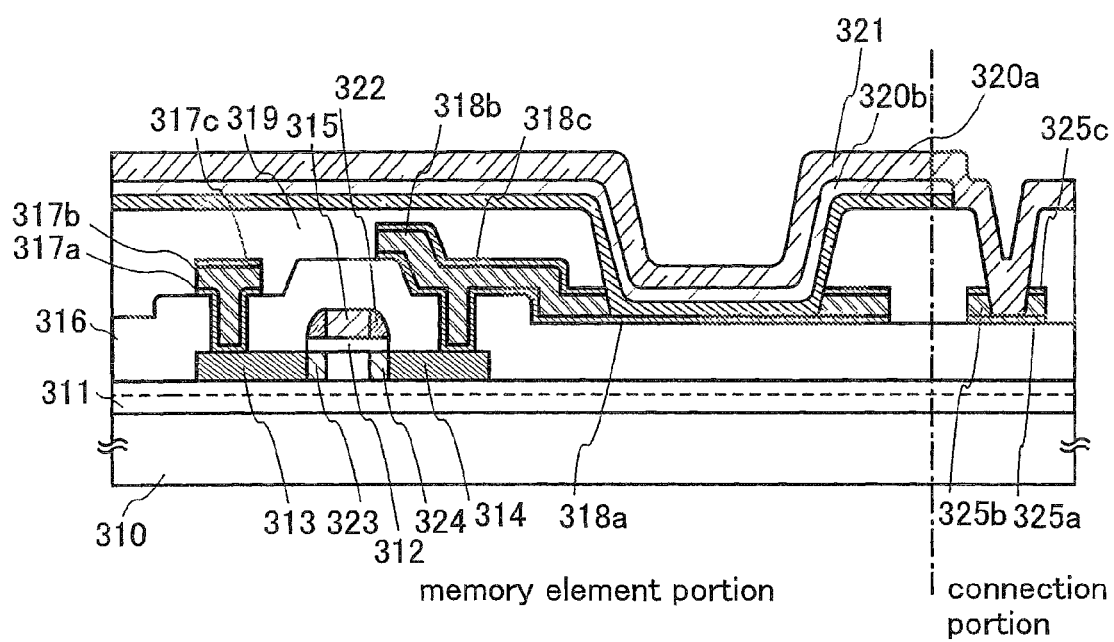
FIG. 3 is a cross-sectional view showing Embodiment Mode 3.

In this embodiment mode, an example of a memory device, which has a different structure from those in Embodiment Modes 1 and 2, is shown in FIG. 3.

The structure shown in FIG. 3 includes a first region where part of a first electrode layer is thinner due to etching using an insulating film 319 as a mask, and the first region is in contact with a laminated layer containing an organic compound (a buffer layer 320a and an organic compound layer 320b) of a memory cell. The insulating film 319 is provided at the boundary between adjacent memory cells to surround and cover the periphery of the first electrode layer.

A first electrode layer including layers 318a to 318c is a conductive layer forming a bit line of a memory element. The first electrode layer including the layers 318a to 318c has a first region with a single layer, a second region with three layers, and a step at the boundary between the first region and the second region. Here, a titanium film as the layer 318a, a film containing aluminum as its main component as the layer 318b, and a titanium film as the layer 318c are sequentially laminated.

In addition, a source line including layers 317a to 317c is also formed with the same laminated structure (three layers in total). The laminated structure (three layers in total) includes a film containing aluminum as its main component, which can serve as a low-resistance wire, and a connection wire including layers 325a to 325c of a connection portion is also formed at the same time.

Note that in FIG. 3, a TFT (n-channel TFT or p-channel TFT) provided over a substrate 310 having an insulating surface is an element for controlling a current flowing to an organic compound layer 320b of a memory cell, and reference numerals 313 and 314 denote source or drain regions. Further, the TFT shown in FIG. 3 has LDD regions 323 and 324 between a channel formation region and the source or drain regions.

A base insulating film 311 (here, a lower layer thereof is a nitride insulating film and an upper layer thereof is an oxide insulating film) is formed over the substrate 310, and a gate insulating film 312 is provided between a gate electrode 315 and a semiconductor layer. In addition, a side face of the gate electrode 315 is provided with a sidewall 322. Further, a reference numeral 316 denotes an interlayer insulating film formed with a single layer of an inorganic material such as silicon oxide, silicon nitride, silicon nitride oxide, aluminum nitride, or aluminum nitride oxide, or a laminated layer thereof.

By providing the buffer layer 320a on the first electrode layer, a distance between the first electrode layer and a second electrode layer 321 in a memory element can be increased, and initial failure due to a short circuit of the memory element caused by surface unevenness of a metal electrode, or the like can be suppressed.

The organic compound layer 320b as the second layer is formed with a single-layer or laminated structure of a layer formed of an organic compound material having conductivity. As a specific example of the organic compound material having conductivity, a material having a carrier transport property can be used.

Note that if there is no particular necessity, the buffer layer 320a need not necessarily be provided.

In the case of the structure shown in FIG. 3, the first layer 318a of the first electrode layer can have a relatively flat surface since it is thinly formed over the flat interlayer insulating film 316. Therefore, initial failure due to a short circuit of the memory element caused by surface unevenness of the metal electrode, or the like can be suppressed.

In the connection portion, the second electrode layer 321 and the first layer 325a of the first electrode layer are in contact with each other, and a side face of a second layer 325b is also in contact with the second electrode layer 321. By employing the structure shown in FIG. 3, a contact area in the connection portion can be increased.

This embodiment mode can be freely combined with Embodiment Mode 1.

Embodiment Mode 4

Figure 4:
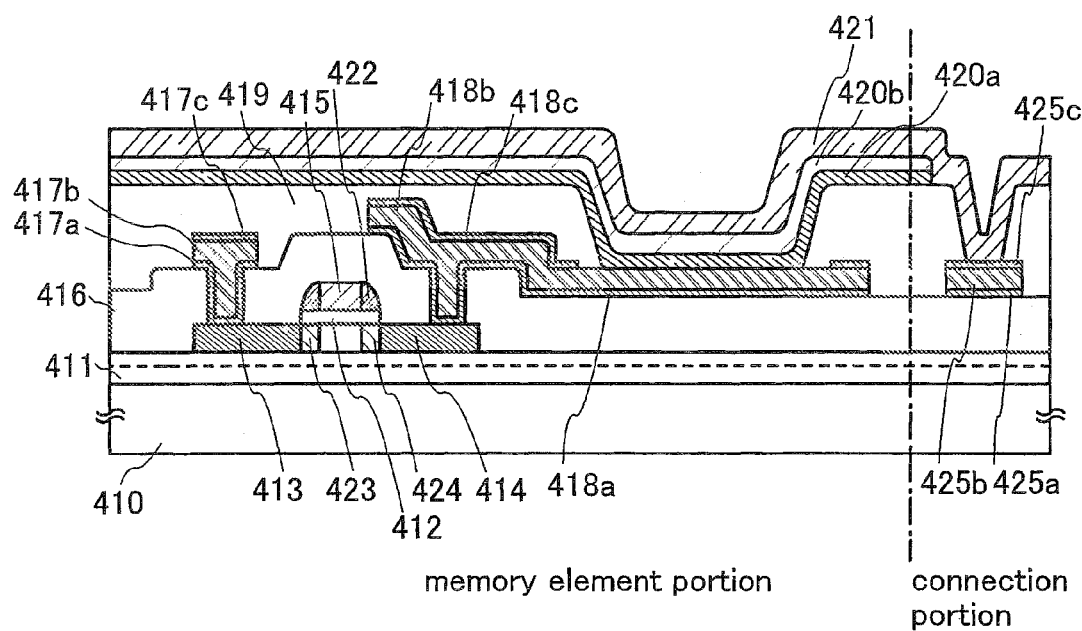
FIG. 4 is a cross-sectional view showing Embodiment Mode 4.

In this embodiment mode, an example of a memory device, which has a structure partly different from that in Embodiment Mode 2, is shown in FIG. 4.

An example of performing etching using an insulating film as a mask is described in Embodiment Mode 2, whereas an example of performing etching with one more additional mask to remove part of a third layer of a first electrode layer is described in this embodiment mode.

The structure shown in FIG. 4 has a first region where part of the first electrode layer is thinner due to etching, and the first region is in contact with a laminated layer containing an organic compound (a buffer layer 420a and an organic compound layer 420b) of a memory cell. An insulating film 419 is provided at the boundary between adjacent memory cells to surround and cover the periphery of the first electrode layer.

A first electrode layer including layers 418a to 418c is a conductive layer forming a bit line of a memory element. The first electrode layer including the layers 418a to 418c has a first region with two layers 418a, 418b, a second region with three layers 418a to 418c, and a step at the boundary between the first region and the second region. Here, a titanium film as the layer 418a, a film containing aluminum as its main component as the layer 418b, and a titanium film as the layer 418c are sequentially laminated.

In the structure shown in FIG. 4, the step at the boundary between the first region and the second region is also covered with the insulating film 419.

In addition, a source line including layers 417a to 417c is also formed with the same laminated structure (three layers in total). The laminated structure (three layers in total) includes a film containing aluminum as its main component, which can serve as a low-resistance wiring, and a connection wiring including layers 425a to 425c of a connection portion is also formed at the same time.

Note that in FIG. 4, a TFT (n-channel TFT or p-channel TFT) provided over a substrate 410 having an insulating surface is an element for controlling a current flowing to the organic compound layer 420b of the memory cell, and reference numerals 413 and 414 denote source or drain regions. Further, the TFT shown in FIG. 4 has LDD regions 423 and 424 between a channel formation region and the source or drain regions.

A base insulating film 411 (here, a lower layer thereof is a nitride insulating film and an upper layer thereof is an oxide insulating film) is formed over the substrate 410, and a gate insulating film 412 is provided between a gate electrode 415 and a semiconductor layer. In addition, a side face of the gate electrode 415 is provided with a sidewall 422. Further, a reference numeral 416 denotes an interlayer insulating film formed with a single layer of an inorganic material such as silicon oxide, silicon nitride, silicon nitride oxide, aluminum nitride, or aluminum nitride oxide, or a laminated layer thereof.

By providing the buffer layer 420a on the first electrode layer, a distance between the first electrode layer and a second electrode layer 421 in a memory element can be increased, and initial failure due to a short circuit of the memory element caused by surface unevenness of a metal electrode, or the like can be suppressed. In the case where the second layer 418b of the first electrode layer and the organic compound layer 420b have poor adhesion to each other, the buffer layer 420a can improve adhesion when provided between these layers.

The organic compound layer 420b as the second layer is formed with a single-layer or laminated structure of a layer formed of an organic compound material having conductivity. As a specific example of the organic compound material having conductivity, a material having a carrier transport property can be used.

Note that if there is no particular necessity, the buffer layer 420a need not necessarily be provided.

This embodiment mode can be freely combined with Embodiment Mode 1.

Embodiment Mode 5

Figure 5:
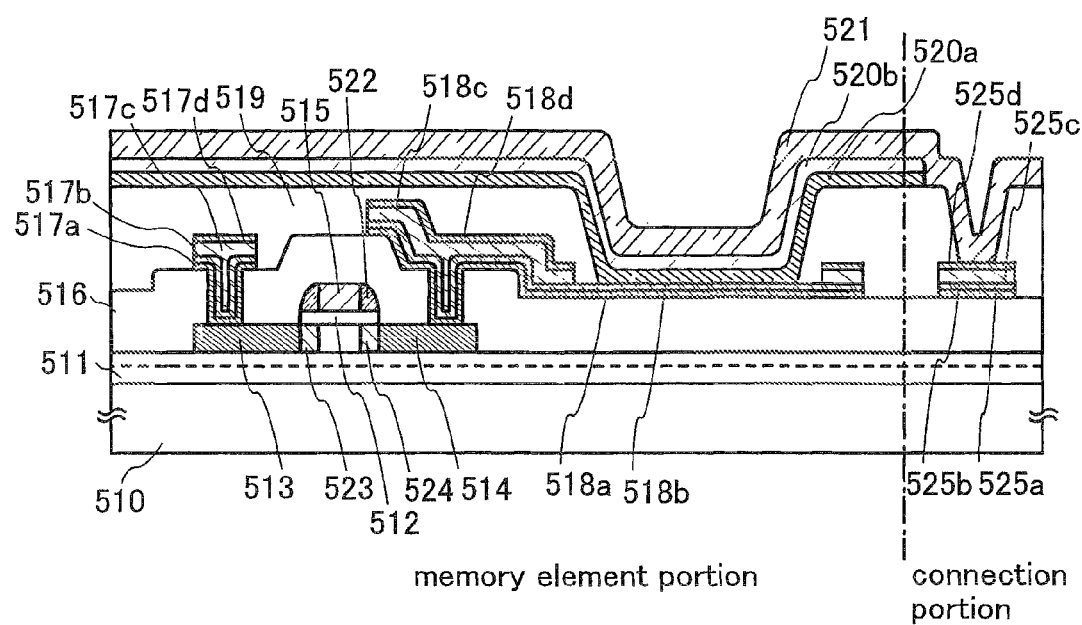
FIG. 5 is a cross-sectional view showing Embodiment Mode 5.

In this embodiment mode, an example of a memory device, which has a structure partly different from that in Embodiment Mode 4, is shown in FIG. 5.

An example of removing part of a third layer of a first electrode layer is described in Embodiment Mode 4, whereas an example where the number of laminated layers in a first electrode layer is four and a fourth layer and a third layer are partly removed is described in this embodiment mode.

The structure shown in FIG. 5 has a first region where part of the first electrode layer is thinner due to etching, and the first region is in contact with a laminated layer containing an organic compound (a buffer layer 520a and an organic compound layer 520b) of a memory cell. An insulating film 519 is provided at the boundary between adjacent memory cells to surround and cover the periphery of the first electrode layer.

A first electrode layer including layers 518a to 518d is a conductive layer forming a bit line of a memory element. The first electrode layer including the layers 518a to 518d has a first region with two layers 518a, 518b, a second region with four layers 518a to 518d, and a step at the boundary between the first region and the second region. Here, a titanium nitride film as the layer 518a, a titanium film as the layer 518b, a film containing aluminum as its main component as the layer 518c, and a titanium film as the layer 518d are sequentially laminated.

In the structure shown in FIG. 5, the step at the boundary between the first region and the second region is also covered with the insulating film 519.

In addition, a source line including layers 517a to 517d is also formed with the same laminated structure (four layers in total). The laminated structure (four layers in total) includes a film containing aluminum as its main component, which can serve as a low-resistance wiring, and a connection wiring including layers 525*a* to 525*d* of a connection portion is also formed at the same time.

Note that in FIG. 5, a TFT (n-channel TFT or p-channel TFT) provided over a substrate 510 having an insulating surface is an element for controlling a current flowing to the organic compound layer 520*b* of the memory cell, and reference numerals 513 and 514 denote source or drain regions. Further, the TFT shown in FIG. 5 has LDD regions 523 and 524 between a channel formation region and the source or drain regions.

A base insulating film 511 (here, a lower layer thereof is a nitride insulating film and an upper layer thereof is an oxide insulating film) is formed over the substrate 510, and a gate insulating film 512 is provided between a gate electrode 515 and a semiconductor layer. In addition, a side face of the gate electrode 515 is provided with a sidewall 522. Further, a reference numeral 516 denotes an interlayer insulating film formed with a single layer of an inorganic material such as silicon oxide, silicon nitride, silicon nitride oxide, aluminum nitride, or aluminum nitride oxide, or a laminated layer thereof.

By providing the buffer layer 520*a* on the first electrode layer, a distance between the first electrode layer and a second electrode layer 521 in a memory element can be increased, and initial failure due to a short circuit of the memory element caused by surface unevenness of a metal electrode, or the like can be suppressed. In the case where the second layer 518*b* of the first electrode layer and the organic compound layer 520*b* have poor adhesion to each other, the buffer layer 520*a* can improve adhesion when provided between these layers.

The organic compound layer 520*b* as the second layer is formed with a single-layer or laminated structure of a layer formed of an organic compound material having conductivity. As a specific example of the organic compound material having conductivity, a material having a carrier transport property can be used.

Note that if there is no particular necessity, the buffer layer 520*a* need not necessarily be provided.

This embodiment mode can be freely combined with Embodiment Mode 1.

Embodiment Mode 6

Figure 6A:
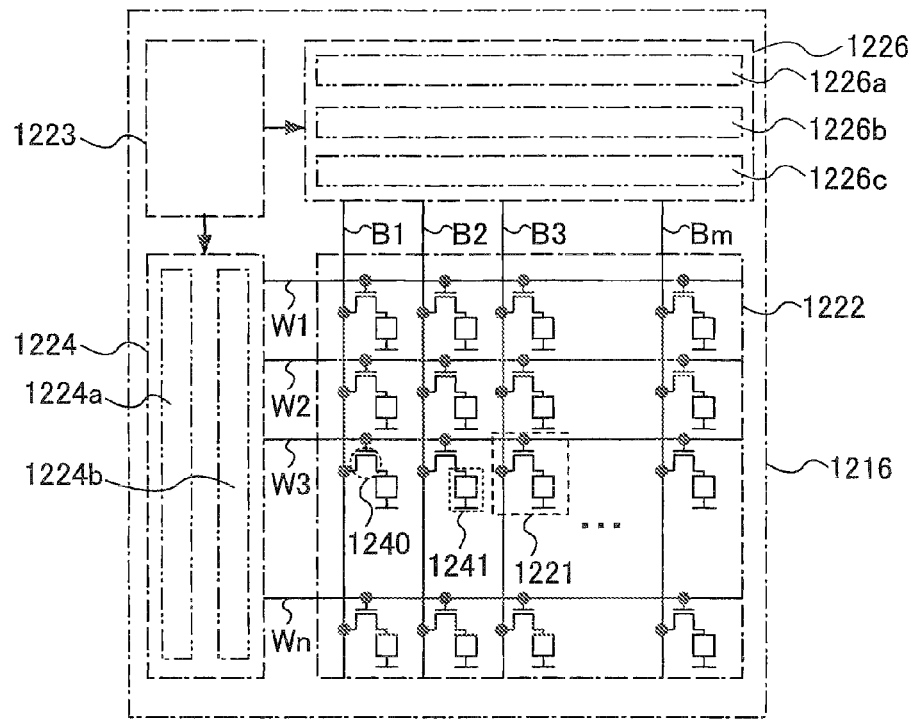
FIGS. 6A and 6B are top views of an active matrix organic memory device (Embodiment Mode 6).

In this embodiment mode, one example of a structure of an organic memory is described below. FIG. 6A shows one example of a structure of an organic memory to be described in this embodiment mode, which includes a memory cell array 1222 in which memory cells 1221 are arranged in matrix; a bit line driver circuit 1226 including a column decoder 1226*a*, a read circuit 1226*b*, and a selector 1226*c*; a word line driver circuit 1224 including a row decoder 1224*a* and a level shifter 1224*b*; and an interface 1223 which has a write circuit and the like and interacts with the outside. Note that the structure of a memory device 1216 described here is merely one example. Another circuit such as a sense amplifier, an output circuit, or a buffer may be included therein, and the write circuit may be provided in the bit line driver circuit.

The memory cell 1221 has a first wire 1231 forming a word line Wy ($1 \leq y \leq n$), a second wire 1232 forming a bit line Bx ($1 \leq x \leq m$), a transistor 1240, and a memory element 1241. The memory element 1241 has a structure in which an organic compound layer is interposed between a pair of conductive layers.

Figure 6B:
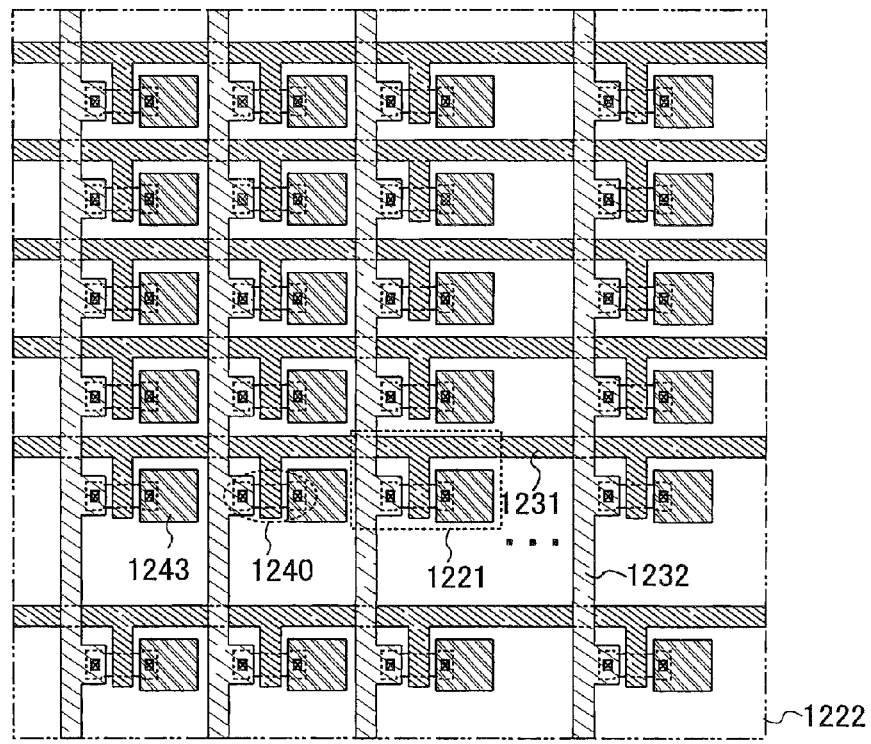

One example of a top surface structure of the memory cell array 1222 is shown in FIG. 6B.

In the memory cell array 1222, the first wire 1231 which extends in a first direction and the second wire 1232 which extends in a second direction perpendicular to the first direction are provided in matrix. The first wire is connected to a source or drain electrode of the transistor 1240, and the second wire is connected to a gate electrode of the transistor 1240. Further, a first electrode layer 1243 is connected to a source or drain electrode of the transistor 1240, to which the first wire is not connected, and a memory element is formed with a laminated structure of the first electrode layer 1243, the organic compound layer, and a second conductive layer.

This embodiment mode can be freely combined with any one of Embodiment Modes 1 to 5.

Embodiment Mode 7

In this embodiment mode, a method for manufacturing an organic memory including an antenna is explained with reference to FIG. 7. Note that FIG. 7 shows an example of using the memory element portion and the connection portion described in Embodiment Mode 1, and the same part as that in FIG. 1 is denoted by the same reference numeral.

Figure 7:
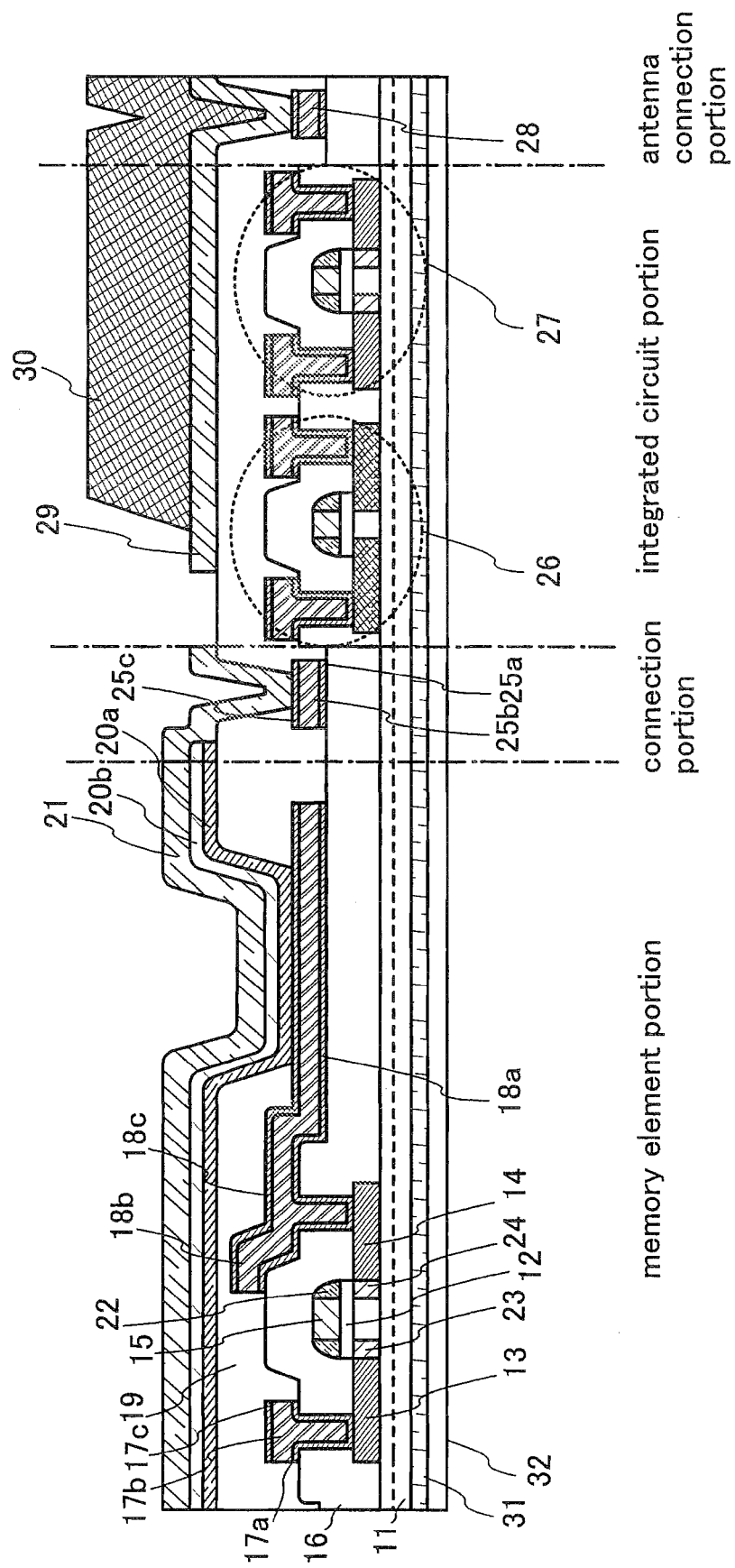
FIG. 7 is a cross-sectional view of a semiconductor device including an organic memory device and an antenna (Embodiment Mode 7).

Note that FIG. 7 shows an integrated circuit portion such as a bit line driver circuit and an antenna in addition to the memory element portion and the connection portion.

First, a peeling layer (also referred to as a separation layer) is formed over a glass substrate, and a base insulating film 11 is formed. Then, a plurality of transistors serving as switching elements of the memory element portion and an n-channel TFT 27 and a p-channel TFT 26 included in a CMOS circuit of the integrated circuit portion are formed over the base insulating film. Note that in this embodiment mode, one of a source electrode and a drain electrode of each transistor provided in the memory element portion has a function as a first electrode layer including layers 18*a* to 18*c*. The first electrode layer including the layers 18*a* to 18*c* can be formed using a vapor deposition method, a sputtering method, a CVD method, a droplet discharge method, a spin coating method, or various printing methods such as screen printing and gravure printing.

In addition, a connection electrode 28 to be connected to an antenna formed in a subsequent step is also formed in the same step as the first conductive layer including the layers 18*a* to 18*c*.

Subsequently, an insulating film 19 is formed to cover an end portion of the first electrode layer including the layers 18*a* to 18*c*. In addition, the insulating film 19 is also formed to cover the n-channel TFT 27 and the p-channel TFT 26 of the integrated circuit portion. The insulating film 19 can be formed using a droplet discharge method, a printing method, or a spin coating method. If necessary, the insulating film 19 is formed into a desired shape by patterning.

Next, a buffer layer 20*a* and a layer 20*b* containing an organic compound are fowled over the first electrode layer including the layers 18*a* to 18*c*. Note that the buffer layer 20*a* and the layer 20*b* containing an organic compound may be entirely formed, or selectively formed so that the organic compound layers provided in respective memory cells are separated from each other.

Subsequently, a second conductive layer 21 is formed over the layer 20*b* containing an organic compound. The second conductive layer 21 can be formed using a vapor deposition method, a sputtering method, a CVD method, a droplet discharge method, a spin coating method, or various printing methods such as screen printing and gravure printing in the same manner as the first conductive layer. A memory element is formed with a laminated structure of at least the first conductive layer including the layers 18a to 18c, the layer 20b containing an organic compound, and the second conductive layer 21.

In the integrated circuit portion, an electrode 29 is formed in the same step as the second conductive layer 21. The electrode 29 is electrically connected to the connection electrode provided in an antenna connection portion. In addition, the electrode 29 can improve adhesion between an antenna to be formed later and the insulating film 19.

Then, an antenna 30 is formed over the electrode 29. Here, the case where the antenna 30 is provided over the insulating film 19 is described; however, the invention is not limited to this structure. The antenna can be provided below the first conductive layer including the layers 18a to 18c or on the same layer.

Note that there are two ways of providing an antenna used for data transmission. One is to provide an antenna over a substrate provided with a plurality of elements and memory elements; the other is to form a terminal portion over a substrate provided with a plurality of elements and memory elements and connect an antenna provided over another substrate to the terminal portion.

Subsequently, the memory element portion including a plurality of memory elements, the connection portion, the integrated circuit portion, and the antenna connection portion, which are provided over the peeling layer, are completely peeled off from the glass substrate. Then, a flexible substrate 32 is attached to the exposed base insulating film 11 with an adhesive layer 31. A cross-sectional view at the stage after this step is completed corresponds to FIG. 7.

The flexible substrate 32 corresponds to a laminated film of a film made of polypropylene, polyester, vinyl, polyvinyl fluoride, vinyl chloride, or the like, paper made of a fibrous material, or a base-material film (polyester, polyimide, an inorganic deposited film, paper, or the like) and an adhesive synthetic resin film (an acrylic synthetic resin, an epoxy synthetic resin, or the like), or the like. As the adhesive layer 31, various types of curing adhesives can be given, for example, a reactive curing adhesive, a thermosetting adhesive, a photo-curing adhesive such as a UV curable adhesive, an anaerobic adhesive, and the like.

An insulating layer serving as a protective layer may be formed by a method such as an SOG method or a droplet discharge method so as to cover the antenna 30. The insulating layer serving as a protective layer may be formed of a layer containing carbon such as DLC (Diamond-Like Carbon), a layer containing silicon nitride, a layer containing silicon nitride oxide, or an organic material, preferably, an epoxy resin.

A peeling method and a transfer method are not particularly limited. For example, a surface of a side on which the antenna is provided may be attached to a first substratum and the glass substrate is completely peeled off. Subsequently, the exposed surface of the base insulating film 11 may be fixed to the flexible substrate 32 that is a second substratum with the adhesive layer 31. In this case, either or both heat treatment and pressure treatment may be performed thereafter to seal the memory element portion with the first substratum and the second substratum.

Note that the peeling layer is formed by a method such as a sputtering method or a plasma CVD method with a single layer or laminated layer of a layer formed of an element selected from tungsten (W), molybdenum (Mo), titanium (Ti), tantalum (Ta), niobium (Nd), nickel (Ni), cobalt (Co), zirconium (Zr), zinc (Zn), ruthenium (Ru), rhodium (Rh), lead (Pd), osmium (Os), iridium (Ir), and silicon (Si) or an alloy or compound material containing the element as its main component. A crystal structure of a layer containing silicon may be any of amorphous, microcrystalline, and polycrystalline structures.

In the case where the peeling layer has a single-layer structure, a tungsten layer, a molybdenum layer, or a layer containing a mixture of tungsten and molybdenum is formed, for example. Alternatively, a layer containing oxide or oxynitride of tungsten, a layer containing oxide or oxynitride of molybdenum, or a layer containing oxide or oxynitride of a mixture of tungsten and molybdenum is formed. Note that the mixture of tungsten and molybdenum corresponds, for example, to an alloy of tungsten and molybdenum. In addition, oxide of tungsten is referred to as tungsten oxide in some cases.

In the case where the peeling layer has a laminated structure, a tungsten layer, a molybdenum layer, or a layer containing a mixture of tungsten and molybdenum is formed as a first layer, and a layer containing oxide, nitride, oxynitride, or nitride oxide of tungsten, molybdenum, or a mixture of tungsten and molybdenum is formed as a second layer.

In the case where a tungsten layer is provided as the peeling layer, by applying mechanical force after forming the base insulating film and the element over the peeling layer, the substrate and the base insulating film can be separated from each other within the peeling layer or at the interface therebetween.

In the case where the peeling layer is removed by etching, it is preferable to form an opening to reach the peeling layer by etching the insulating film using a photolithography method.

Note that in the case of forming a laminated structure of a layer containing tungsten and a layer containing oxide of tungsten, the fact that a layer containing oxide of tungsten is formed at the interface between a tungsten layer and a silicon oxide layer by forming the layer containing tungsten and the layer containing silicon oxide thereover, may be utilized. This applies to the case of forming layers containing nitride, oxynitride, and nitride oxide of tungsten. After forming a layer containing tungsten, a silicon nitride layer, a silicon oxynitride layer, and a silicon nitride oxide layer may be formed thereover. Oxide of tungsten is expressed as $WO_X$. X is 2 to 3, and there are cases where X is 2 ($WO_2$), X is 2.5 ($W_2O_5$), X is 2.75 ($W_4O_{11}$), X is 3 ($WO_3$), and the like. In forming oxide of tungsten, there is no particular limitation on the above given value of X, and it may be determined which oxide is formed, based on an etching rate or the like. Note that that which has the best etching rate is a layer containing oxide of tungsten ($WO_X$, $0<X<3$) formed by a sputtering method in an oxygen atmosphere. Accordingly, it is preferable to form a layer containing oxide of tungsten as the peeling layer by a sputtering method in an oxygen atmosphere for the sake of reduction in manufacturing time.

Alternatively, another peeling method may be used, in which amorphous silicon (or polysilicon) is used for a peeling layer and a gap is generated by releasing hydrogen contained in the amorphous silicon by laser light irradiation to separate the substrate.

In accordance with the above steps, a semiconductor device including a memory element portion and an antenna can be manufactured. In addition, in accordance with the above steps, a flexible semiconductor device can be obtained.

Further, mass production of the semiconductor device including a memory element portion and an antenna becomes possible by using a large-sized substrate (having a size of, for example, 680×880 mm, 730×920 mm, or larger). Note that in the case of forming a large number of semiconductor devices over one substrate, a separately dividing step becomes necessary.

This embodiment mode can be freely combined with any one of Embodiment Modes 1 to 6.

Embodiment Mode 8

In this embodiment mode, the case of using a semiconductor device of the invention as a wireless chip which can transmit and receive data without contact is explained with reference to FIGS. 8A to 8C.

Figure 8A:
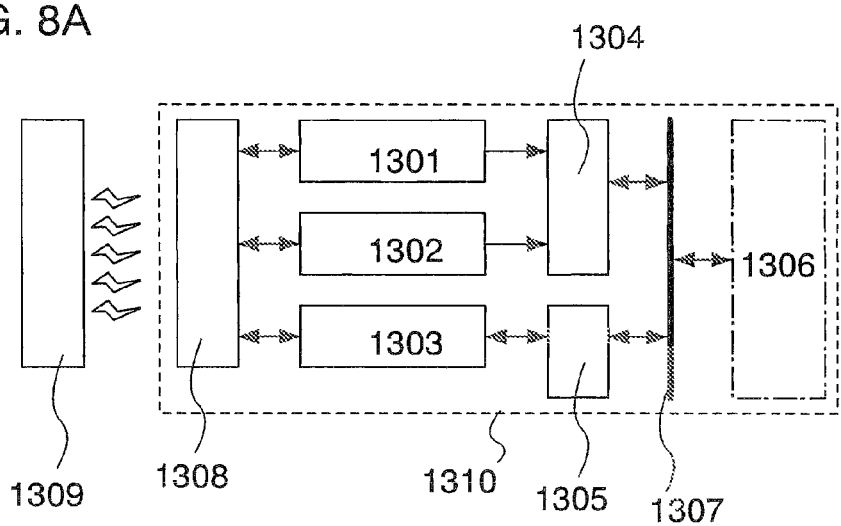
FIGS. 8A to 8C are a block diagram of a wireless chip and diagrams showing usage examples of a wireless chip.
Figure 8B:
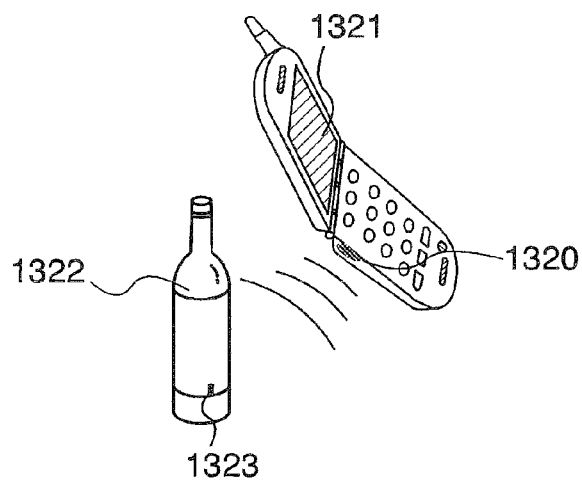

A wireless chip 1310 has a function of communicating data without contact, and includes a power source circuit 1301, a clock generator circuit 1302, a data demodulation/modulation circuit 1303, a control circuit 1304 for controlling another circuit, an interface circuit 1305, a memory 1306, a data bus 1307, and an antenna (an antenna coil) 1308 (FIG. 8A).

The power source circuit 1301 is a circuit for generating a variety of power sources which are to be supplied to the respective circuits inside the semiconductor device, based on an AC signal inputted from the antenna 1308. The clock generator circuit 1302 is a circuit for generating various clock signals to be supplied to the respective circuits inside the semiconductor device, based on an AC signal inputted from the antenna 1308. The data demodulation/modulation circuit 1303 has a function of demodulating/modulating data which are communicated with a reader/writer 1309. The control circuit 1304 has a function of controlling the memory 1306. The antenna 1308 has a function of transmitting and receiving an electromagnetic field or electric wave. The reader/writer 1309 controls processing regarding communication with the semiconductor device, control of the semiconductor device, and data thereof.

The memory 1306 is formed with any of the structures of the organic memories described in Embodiment Modes 1 to 5. Note that a structure of the wireless chip is not limited to the above structure. For example, a structure with another component such as a limiter circuit for power source voltage or hardware dedicated to cryptographic processing may be used.

In addition, the wireless chip may supply a power source voltage to each circuit by an electric wave without a power source (battery) mounted thereon, by a power source (battery) mounted thereon in place of an antenna, or by an electric wave and a power source (battery).

In the case of using the semiconductor device of the invention as a wireless chip or the like, there are advantages in that communication is performed without contact, plural pieces of data can be read, data can be written in the wireless chip, the wireless chip can be processed into various shapes, the wireless chip has a wide directional characteristic and a wide recognition range depending on a frequency to be selected, and the like. The wireless chip can be applied to an IC tag with which individual information on persons and goods can be identified by wireless communication without contact, a label that can be attached to an object by performing labeling treatment, a wristband for an event or an amusement, or the like. Further, the wireless chip may be shaped by using a resin material, or may be directly fixed to metal that hinders wireless communication. Moreover, the wireless chip can be utilized for system operation such as an entrance/exit management system and an account system.

Subsequently, one mode of practical use of a semiconductor device as a wireless chip is explained. A side face of a portable terminal including a display portion 1321 is provided with a reader/writer 1320, and a side face of an article 1322 is provided with a wireless chip 1323 (FIG. 8B).

When the reader/writer 1320 is held over the wireless chip 1323 included in the article 1322, information on the article 1322 such as a raw material, the place of origin, an inspection result in each production process, the history of distribution, or an explanation of the article is displayed on the display portion 1321. If the wireless chip is formed over a flexible substrate, the wireless chip can be attached to a curved surface of a product, which is convenient.

Figure 8C:
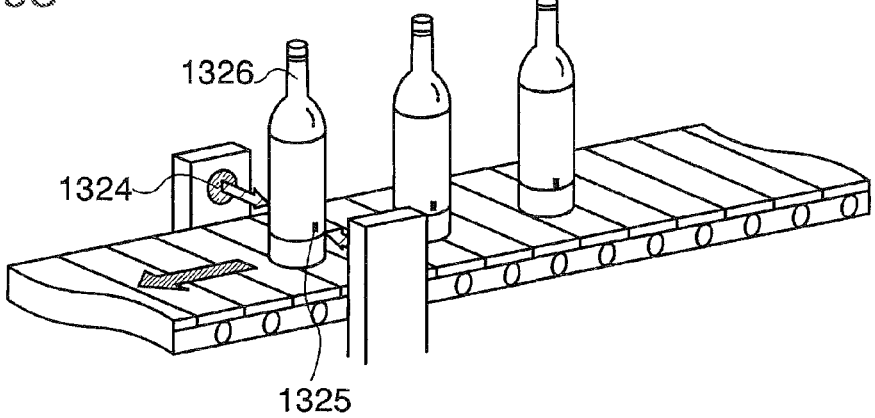

Further, when a product 1326 is transported by a conveyor belt, the product 1326 can be inspected using a reader/writer 1324 and a wireless chip 1325 provided over the product 1326 (FIG. 8C). Thus, by utilizing a wireless chip for a system, information can be acquired easily, and improvement in functionality and added value of the system can be achieved.

Note that the wireless chip of the invention can be mounted on paper money, coins, securities, certificates, bearer bonds, packing containers, books, recording media, personal belongings, vehicles, food, clothing, health products, commodities, medicine, electronic devices, and the like.

This embodiment mode can be freely combined with any one of Embodiment Modes 1 to 7.

The present invention can reduce the number of steps in mass-producing a semiconductor device including an organic memory. Further, a semiconductor device including an organic memory can be mass-produced using a large-sized substrate of 680×880 mm, 730×920 mm, or larger.

What is claimed is:

1. A semiconductor device comprising:
   a first driver circuit;
   a second driver circuit; and
   a memory cell including a first wiring, a second wiring, a transistor, a first conductive layer, a layer, and a second conductive layer, the transistor having a semiconductor film including a channel formation region,
   wherein the first wiring is electrically connected to the first driver circuit,
   wherein the second wiring is electrically connected to the second driver circuit,
   wherein the semiconductor film includes a metal oxide and the metal oxide includes indium,
   wherein the first conductive layer is electrically connected to the transistor,
   wherein each of the layer and the second conductive layer is located over the transistor,
   wherein the first conductive layer is overlapped with the second conductive layer, and
   wherein the layer is interposed between the first conductive layer and the second conductive layer.

2. The semiconductor device according to claim 1, wherein the layer includes an organic compound.

3. The semiconductor device according to claim 1, wherein the first driver circuit comprises at least one of a column decoder, a read circuit, and a level shifter.

4. The semiconductor device according to claim 1, wherein the second driver circuit comprises a row decoder.

5. The semiconductor device according to claim 1, wherein the transistor is any one of a top gate transistor, a bottom gate transistor, and a forward stagger transistor.

6. The semiconductor device according to claim 1, wherein the metal oxide is In—Ga—Zn—O.

7. A semiconductor device comprising:
   a first driver circuit;
   a second driver circuit; and
   a memory cell including a first wiring, a second wiring, a first transistor, and a second transistor, at least one of the first transistor and the second transistor having a semiconductor film including a channel formation region,
   wherein the first wiring is electrically connected to the first driver circuit, wherein the second wiring is electrically connected to the second driver circuit, and wherein the semiconductor film includes a metal oxide and the metal oxide includes indium.

8. The semiconductor device according to claim 7, wherein the memory cell further comprises a first conductive layer electrically connected to the first transistor, a layer including an organic compound, and a second conductive layer, wherein the first conductive layer is overlapped with the second conductive layer, and wherein the layer including the organic compound is interposed between the first conductive layer and the second conductive layer.

9. The semiconductor device according to claim 7, wherein the first driver circuit comprises at least one of a column decoder, a read circuit, and a level shifter.

10. The semiconductor device according to claim 7, wherein the second driver circuit comprises a row decoder.

11. The semiconductor device according to claim 7, wherein the first transistor and the second transistor are any one of a top gate transistor, a bottom gate transistor, and a forward stagger transistor.

12. The semiconductor device according to claim 7, wherein the metal oxide is In—Ga—Zn—O.

13. The semiconductor device according to claim 7, wherein both of the first transistor and the second transistor have the semiconductor film.

14. The semiconductor device according to claim 7, further comprising an antenna.

15. A semiconductor device comprising:
an integrated circuit comprising:
a first driver circuit;
a second driver circuit; and
a memory cell,
wherein the memory cell comprises a first wiring, a second wiring, a first transistor, a second transistor, at least one of the first transistor and the second transistor having a semiconductor film including a channel formation region, wherein the first wiring is electrically connected to the first driver circuit, wherein the second wiring is electrically connected to the second driver circuit, wherein the semiconductor film includes a metal oxide and the metal oxide includes indium.

16. The semiconductor device according to claim 15, wherein the memory cell further comprises a first conductive layer electrically connected to the first transistor, a layer including an organic compound, and a second conductive layer, wherein the first conductive layer is overlapped with the second conductive layer, and wherein the layer including the organic compound is interposed between the first conductive layer and the second conductive layer.

17. The semiconductor device according to claim 15, wherein the first driver circuit comprises at least one of a column decoder, a read circuit, and a level shifter.

18. The semiconductor device according to claim 15, wherein the second driver circuit comprises a row decoder.

19. The semiconductor device according to claim 15, wherein the first transistor and the second transistor are any one of a top gate transistor, a bottom gate transistor, and a forward stagger transistor.

20. The semiconductor device according to claim 15, wherein the metal oxide is In—Ga—Zn—O.

21. The semiconductor device according to claim 15, wherein both of the first transistor and the second transistor have the semiconductor film.

22. The semiconductor device according to claim 15, further comprising an antenna including the memory cell.

* * * * *

UNITED STATES PATENT AND TRADEMARK OFFICE
CERTIFICATE OF CORRECTION

PATENT NO. : 8,526,216 B2  
APPLICATION NO. : 13/546013  
DATED : September 3, 2013  
INVENTOR(S) : Yoshinobu Asami et al.

Page 1 of 1

It is certified that error appears in the above-identified patent and that said Letters Patent is hereby corrected as shown below:

In the Specification

Column 2, line 46, "fowling" should be --forming--;

Column 6, line 57, "a and" should be --a TFT and--;

Column 12, line 54, "fowled" should be --formed--;

Column 13, line 34, "polyimide" should be --polyamide--.

Signed and Sealed this  
Thirty-first Day of December, 2013

Margaret A. Focarino  
*Commissioner for Patents of the United States Patent and Trademark Office*